(12) United States Patent
Fang et al.

(10) Patent No.: US 8,679,974 B2
(45) Date of Patent: Mar. 25, 2014

(54) METHOD FOR FABRICATING INTERCONNECTING LINES INSIDE VIA HOLES OF SEMICONDUCTOR DEVICE

(75) Inventors: Wei-leun Fang, Hsinchu (TW); Chia Han Lin, Hsinchu (TW); Feng Yu Lee, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 221 days.

(21) Appl. No.: 13/416,627

(22) Filed: Mar. 9, 2012

(65) Prior Publication Data

US 2013/0157459 A1 Jun. 20, 2013

(30) Foreign Application Priority Data

Dec. 19, 2011 (TW) .............................. 100147037 A

(51) Int. Cl.
*H01L 21/44* (2006.01)
(52) U.S. Cl.
USPC ........... 438/667; 438/660; 438/666; 438/672; 438/674; 438/675
(58) Field of Classification Search
USPC .................. 438/660, 666, 667, 672, 674, 675
See application file for complete search history.

(56) References Cited

U.S. PATENT DOCUMENTS

| | | | | |
|---|---|---|---|---|
| 7,211,502 B2 * | 5/2007 | Yamazaki et al. | ............ | 438/597 |
| 7,663,113 B2 * | 2/2010 | Shibayama et al. | ..... | 250/370.09 |
| 7,683,458 B2 * | 3/2010 | Akram et al. | .................. | 257/621 |
| 8,304,863 B2 * | 11/2012 | Filippi et al. | .................. | 257/621 |
| 2003/0092256 A1 | 5/2003 | Mashino | | |

* cited by examiner

*Primary Examiner* — Bac Au
(74) *Attorney, Agent, or Firm* — Muncy, Geissler, Olds & Lowe, P.C.

(57) ABSTRACT

A method for fabricating interconnecting lines inside via holes of a semiconductor device comprises steps of providing a template having a receiving trench and a connection surface both on the same side of the template; filling an electric-conduction material into the receiving trench; connecting a substrate having at least one via hole with the connection surface to interconnect the via hole with the receiving trench; heating the electric-conduction material to a working temperature to liquefy a portion of the electric-conduction material and make it flows from the receiving trench into the via hole; and cooling the electric-conduction material to form an interconnecting line inside the via hole. The present invention fabricates interconnecting lines by a heat-forming method, which features simple steps and has advantages of shorter fabrication time, lower fabrication complexity, higher fabrication efficiency, higher yield and lower fabrication cost.

11 Claims, 12 Drawing Sheets

METHOD FOR FABRICATING INTERCONNECTING LINES INSIDE VIA HOLES OF SEMICONDUCTOR DEVICE

FIELD OF THE INVENTION

The present invention relates to a fabrication process of semiconductor, particularly to a method for fabricating interconnecting lines inside via holes of a semiconductor device.

BACKGROUND OF THE INVENTION

In evolution of fabricating semiconductor, the integration level of IC always obeys the Moore's law. However, the Moore's law confronts a real challenge after the feature size of IC has evolved from 65 nm to 40 nm or even 28 nm, because of the physical limit, equipment cost and system complexity. In order to achieve the highest space efficiency, the semiconductor technology has proceeded to the 3D high-density stacking wiring technology.

Among the 3D high-density stacking wiring technology, the TSV (Through-Silicon Via) technology is a critical technology, which uses vertical conduction to implement electric connection among stacked chips, whereby the integration level and performance is effectively promoted with lower cost, and whereby a high-performance chip can be fabricated in a smaller size.

For example, a U.S. Patent Publication No. 20030092256 disclosed a "Method of Manufacturing Semiconductor and Its Device", which comprises steps of: forming first holes not penetrating a support side semiconductor substrate on one face of the support side semiconductor substrate; forming a ground insulating film; forming primary connection plugs by charging copper into the first holes; forming a semiconductor film on one face side of the support side semiconductor substrate via an intermediate insulating film; forming elements on the semiconductor film; exposing bottom faces of the primary connection plugs by polishing the other face of the support side semiconductor substrate; forming second holes extending from the element forming face of the semiconductor film to the primary connection plugs; and forming auxiliary connection plugs for electrically connecting the elements with the primary connection plugs by charging copper into the second holes.

However, the conventional TSV technology involves many steps of photomask fabrication, photolithography, sputtering, electroplating, etc., which are complicated and time-consuming, and thus which has more instability factors in the fabrication process and needs higher fabrication cost.

SUMMARY OF THE INVENTION

The primary objective of the present invention is to solve the problem that the complicated, time-consuming and high-cost process impairs the TSV technology. To achieve the abovementioned objective, the present invention proposes a method for fabricating interconnecting lines inside via holes of a semiconductor device, which comprises Step S1: providing a template having a receiving trench and a connection surface, wherein the receiving trench and the connection surface are on the same side of the template;

Step S2: filling an electric-conduction material into the receiving trench;

Step S3: connecting a substrate having at least one via hole with the connection surface to interconnect the via hole with the receiving trench;

Step S4: heating the electric-conduction material to a working temperature to liquefy a portion of the electric-conduction material and enable the electric-conduction material to flow from the receiving trench into the vial hole; and Step S5: cooling the electric-conduction material to form an interconnecting line inside the via hole.

The present invention uses a heat-forming method to fabricate interconnecting lines. In comparison with the conventional technology, the method of the present invention can fabricate interconnecting lines with simple steps. Therefore, the present invention has advantages of shorter fabrication time, lower fabrication complexity, higher fabrication efficiency, higher yield and lower fabrication cost.

BRIEF DESCRIPTION OF THE DRAWINGS

FIG. 1 is assigned to be the representative drawing.

DETAILED DESCRIPTION OF THE PREFERRED EMBODIMENTS

The technical contents of the present invention are described in detail in cooperation with the drawings below.

Figure 1:
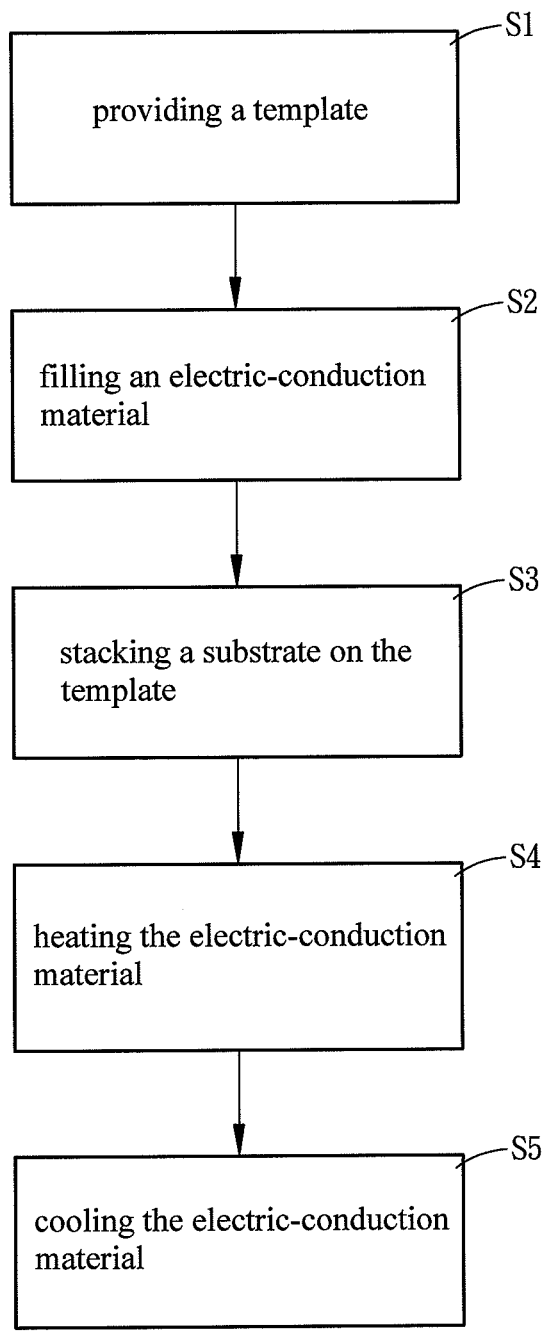
FIG. 1 shows a flowchart of a method according to a first embodiment of the present invention.

Refer to FIG. 1 and FIGS. 2A-2D. FIG. 1 shows a flowchart of a method according to a first embodiment of the present invention. FIGS. 2A-2D schematically show steps of the method according to the first embodiment of the present invention. The method of the present invention comprises the following steps.

Figure 2A:
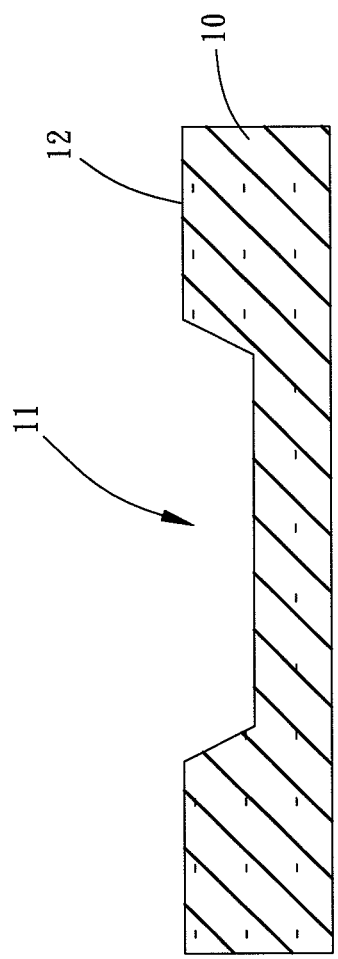
FIGS. 2A-2D schematically show steps of the method according to the first embodiment of the present invention.

Step S1: provide a template 10 having a receiving trench 11 and a connection surface 12, as shown in FIG. 2A. The receiving trench 11 and the connection surface 12 are on the same side of the template 10. In the first embodiment, the receiving trench 11 is fabricated via a laser method, a chemical method or a mechanical method. In the first embodiment, the template 10 is made of silicon. However, the present invention does not constrain that the template 10 should be made of silicon.

Figure 2B:
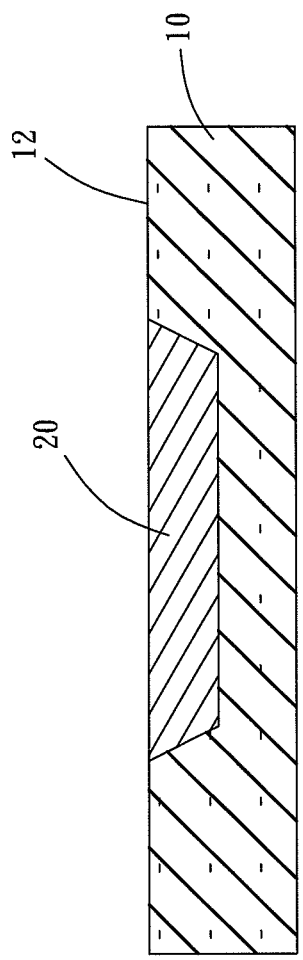
Figure 2C:
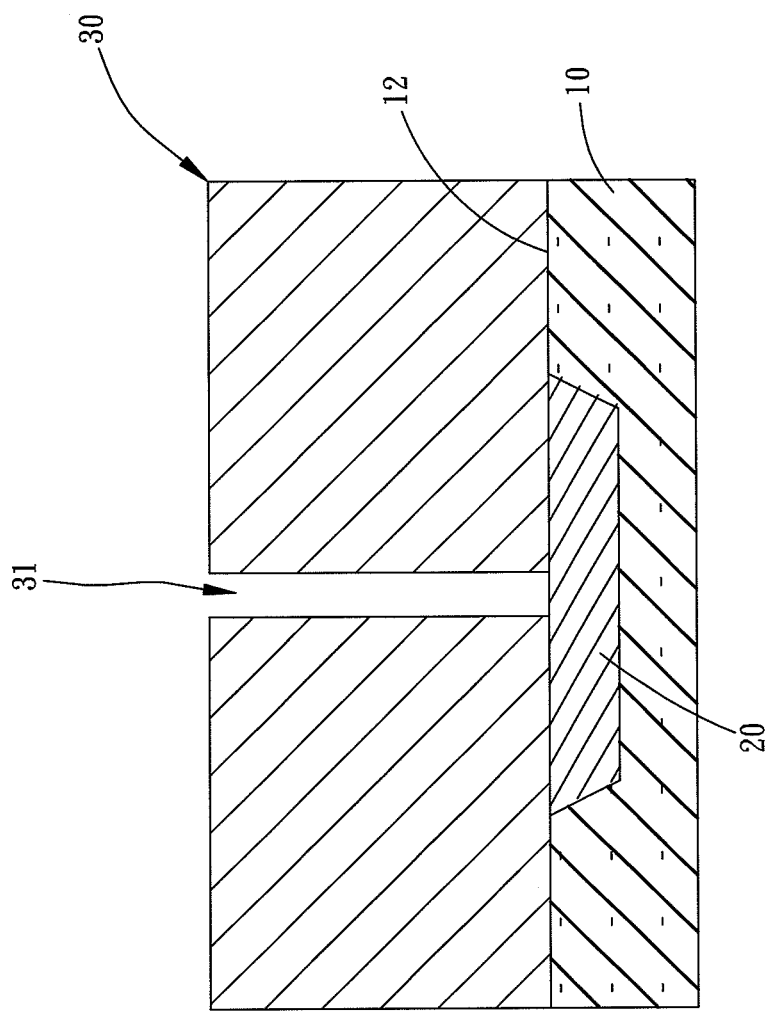
Figure 2D:
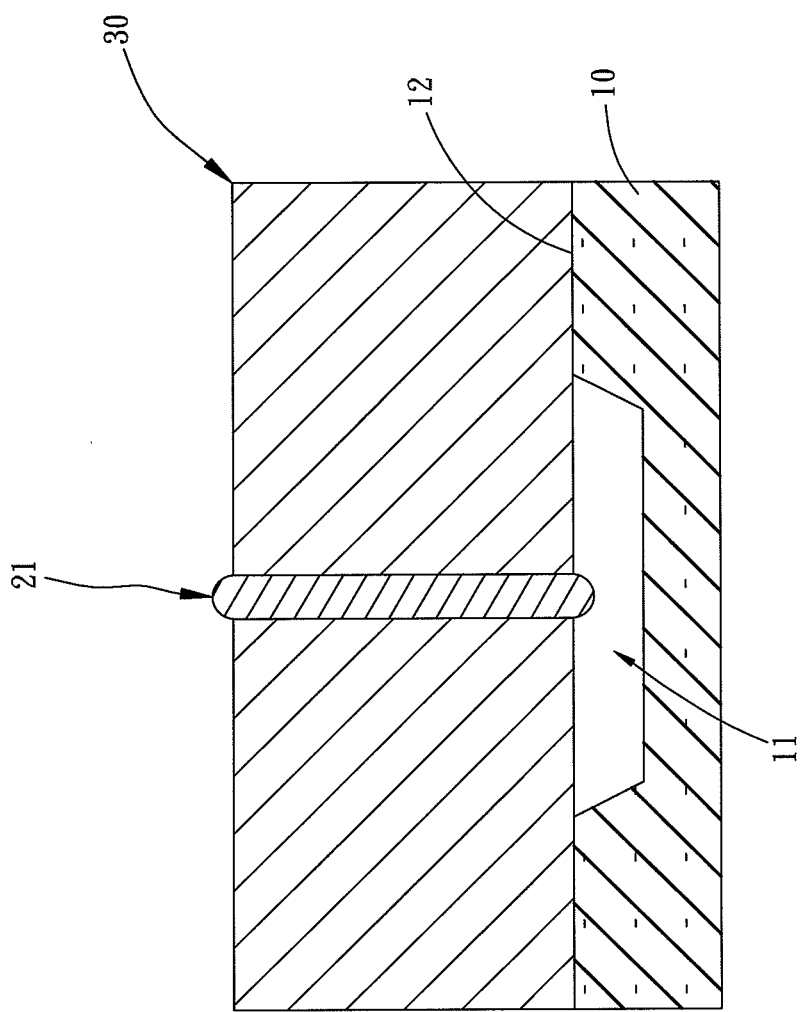

Step S2: fill an electric-conduction material 20 into the receiving trench 11, as shown in FIG. 2B. The electric-conduction material 20 is an electric-conduction paste containing a metallic material and a polymeric carrier, such as a silver glue, a gold glue, or a solder paste. In the first embodiment, the electric-conduction material 20 is a solder paste.

Step S3: connect a substrate 30 having at least one via hole 31 with the connection surface 12 to interconnect the via hole 31 with the receiving trench 11. In the first embodiment, the substrate 30 is a silicon substrate and has a single via hole 31. In the first embodiment, the via hole 31 is fabricated via a laser method, a chemical method or a mechanical method. In the first embodiment, the substrate 30 is aligned to the template 10 and connected with the template 10 with its own weight.

Step S4: heat the electric-conduction material 20 to a working temperature to liquefy a portion of the electric-conduction material 20 and enable the molten electric-conduction materials 20 to flow from the receiving trench 11 into the via hole 31. In the first embodiment, the electric-conduction material 20 is a solder paste, and the working temperature is between 120 and 250° C. At the temperature of 120-250° C., the solder paste gradually melts and flows into the via hole 31.

Step S5: cool the electric-conduction material 20. Thus, the electric-conduction material 20 forms an interconnecting line 21 inside the via hole 31. In the first embodiment, the electric-conduction material 20 is cooled down at an ambient temperature. However, the present invention doses not constrain that the electric-conduction material 20 should be cooled down at an ambient temperature. In the present invention, cooing can be undertaken in any way as long as the molten electric-conduction material 20 can be cooled and solidified into an interconnecting line 21 inside the via hole 31.

Figure 3:
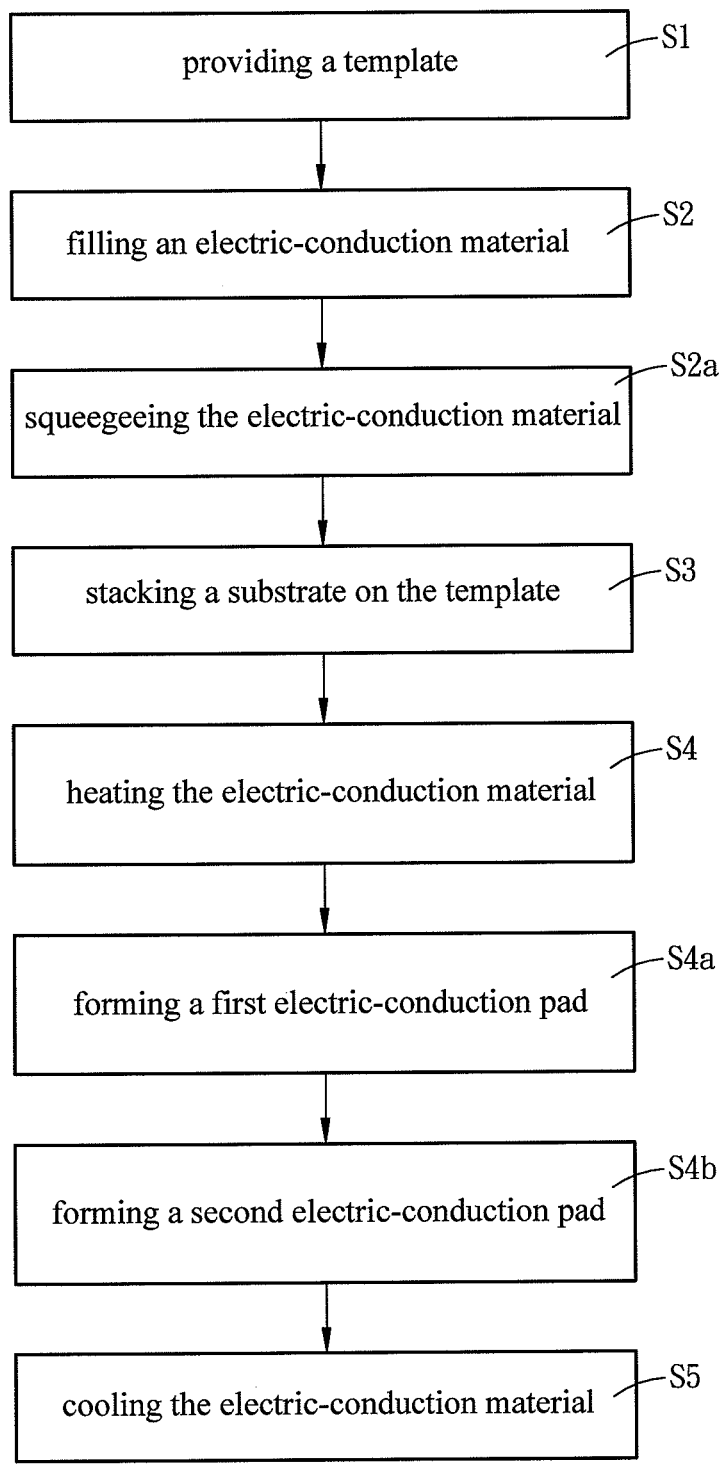
FIG. 3 shows a flowchart of a method according to a second embodiment of the present invention.

Refer to FIG. 3 and FIGS. 4A-4F. FIG. 3 shows a flowchart of a method according to a second embodiment of the present invention. FIGS. 4A-4F schematically show steps of the method according to the second embodiment of the present invention. The second embodiment is described in detail below.

Figure 4A:
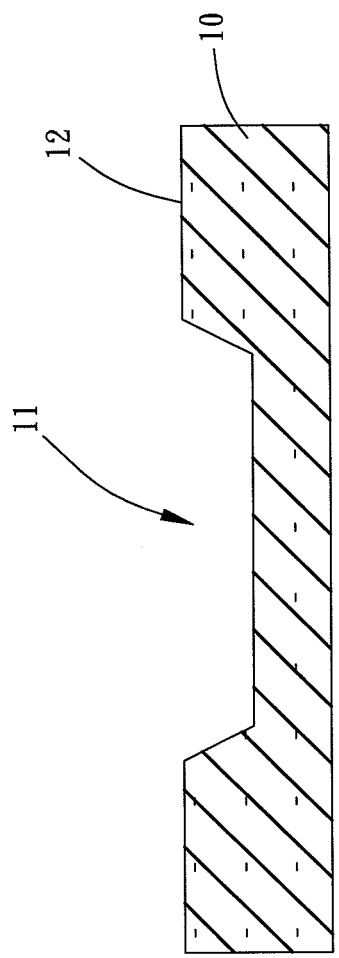
FIGS. 4A-4F schematically show steps of the method according to the second embodiment of the present invention.
Figure 4B:
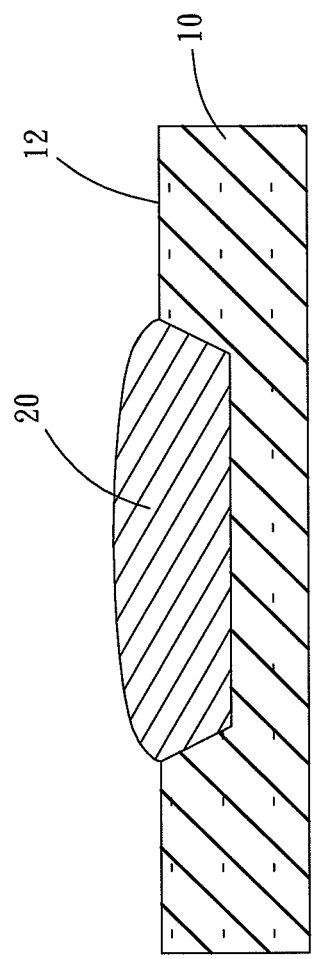
Figure 4C:
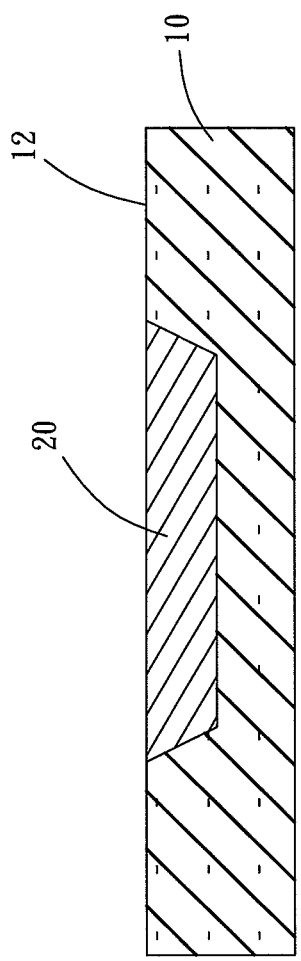

Refer to FIGS. 4A-4C. In Step S1 of the second embodiment, similarly provide a template 10 having a receiving trench 11 and a connection surface 12. In Step S2, fill an electric-conduction material 20 into the receiving trench 11. The electric-conduction material 20 is likely to protrude from the connection surface 12. In Step S2a, a squeegee is used to squeegee the electric-conduction material 20 protruding from the connection surface 12 so that the electric-conduction material 20 is within the receiving trench 11 but not higher than the connection surface 12.

Figure 4D:
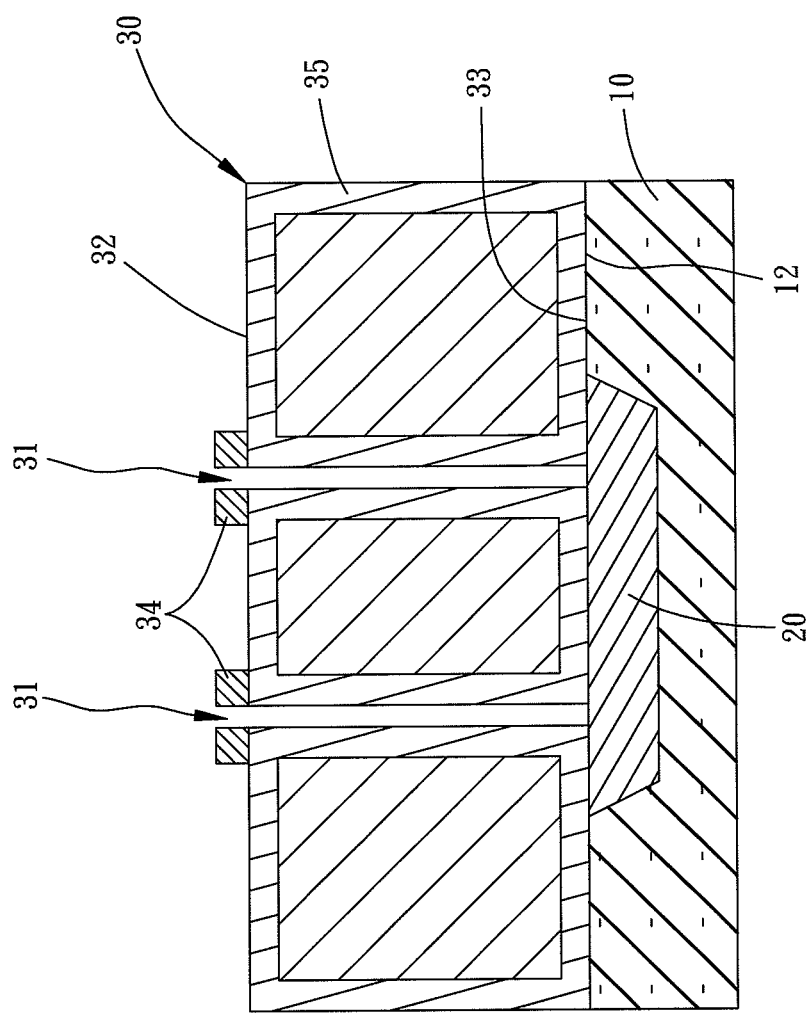

Refer to FIG. 4D. In Step S3, connect a substrate 30 with the connection surface 12. In the second embodiment, the substrate 30 has two via holes 31. The via holes 31 are aligned to interconnect with the receiving trench 11. In the second embodiment, the substrate 30 is a silicon substrate. The substrate 30 is treated with a SOI (Silicon-On-Insulator) process to have a silicon dioxide insulating film 35 on the surface thereof. The substrate 30 has a first surface 32, a circuit 34, and a second surface 33. The first surface 32 is on one side of the substrate 30, which is far away from the template 10. The circuit 34 is formed on the first surface 32 and near the rim of the via hole 31. The second surface 33 is on the other side of the substrate 30, which neighbors the template 10.

Figure 4E:
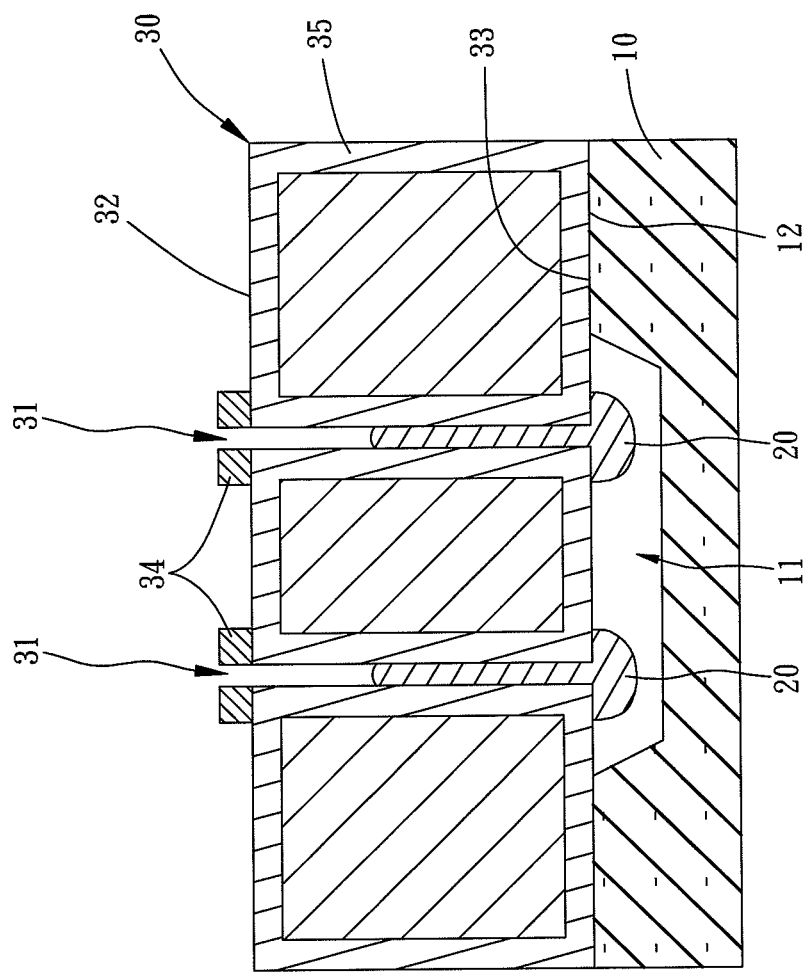
Figure 4F:
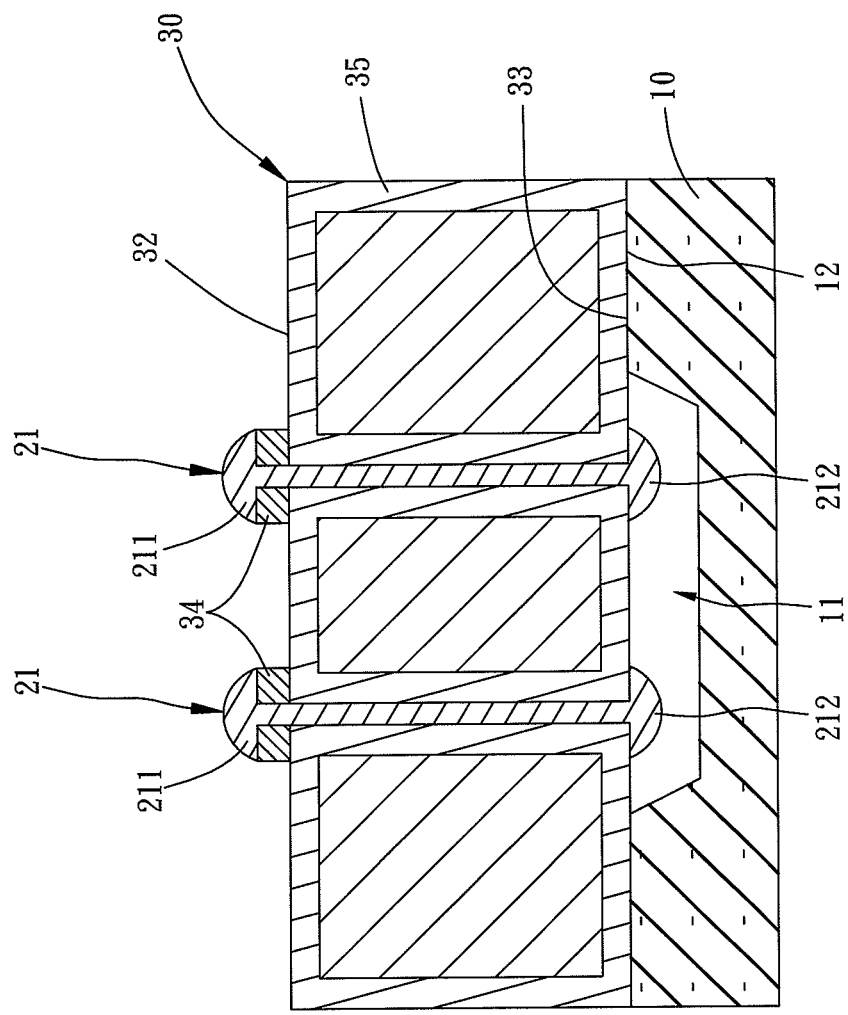

Refer to FIG. 4E and FIG. 4F. In Step S4, heat the electric-conduction material 20 to a working temperature to make the electric-conduction material 20 gradually melt and flow into the via holes 31. In Step S4a, when the electric-conduction material 20 is flowing into the via holes 31, keep heating the electric-conduction material 20 to make a portion of the electric-conduction material 20 flow out of the via holes 31; thus, the electric-conduction material 20 protrudes from the first surface 32 and extends radially to form a first electric-conduction pad 211. In the second embodiment, the first electric-conduction pad 211 contacts the circuit 34. If there is no circuit 34 in the rim of the via hole 31, the electric-conduction pad 211 contacts the first surface 32. In Step S4b, stop heating the electric-conduction material 20 to make a portion of the electric-conduction material 20 remain outside the via hole 31 and protrude from the second surface 33 to form a second electric-conduction pad 212 contacting the second surface 33. In Step S5, cool the electric-conduction material 20 to solidify the electric-conduction material 20 and form inside the via holes 31 interconnecting lines 21 having the first and second electric-conduction pads 211 and 212.

In other embodiments, merely Step S4a or Step S4b is undertaken between Step S4 and Step S5 to make the interconnecting line 21 have only the first electric-conduction pad 211 or the second electric-conduction pad 212. In conclusion, the present invention uses a heat-forming method to fabricate interconnecting lines. In comparison with the conventional technology, the method of the present invention can fabricate interconnecting lines with simple steps. Therefore, the present invention has advantages of shorter fabrication time, lower fabrication complexity, higher fabrication efficiency, higher yield and lower fabrication cost. Further, the present invention can control the heating time to optionally provide the interconnecting line with a first electric-conduction pad and a second electric-conduction pad, which can electrically connect with a circuit or implement vertical conduction with other substrates stacked on the original substrate.

Therefore, the present invention possesses utility, novelty and non-obviousness and meets the condition for a patent. Thus, the Inventors file the application for a patent. It is appreciated if the patent is approved fast.

The embodiments described above are only to exemplify the present invention but not to limit the scope of the present invention. Any equivalent modification or variation according to the spirit of the present invention is to be also included within the scope of the present invention.

What is claimed is:

1. A method for fabricating interconnecting lines inside via holes of a semiconductor device, comprising:
   Step S1: providing a template including a receiving trench and a connection surface, wherein the receiving trench and the connection surface are on the same side of the template;
   Step S2: filling an electric-conduction material into the receiving trench;
   Step S3: connecting a substrate including at least one via hole with the connection surface to interconnect the via hole with the receiving trench;
   Step S4: heating the electric-conduction material to a working temperature to liquefy a portion of the electric-conduction material and enable the electric-conduction material to flow from the receiving trench into the via hole; and
   Step S5: cooling the electric-conduction material to form an interconnecting line inside the via hole.

2. The method for fabricating interconnecting lines inside via holes of a semiconductor device according to claim 1 further comprising Step 2a of squeegeeing the electric-conduction material protruding from the template after Step S2.

3. The method for fabricating interconnecting lines inside via holes of a semiconductor device according to claim 1, wherein the substrate includes a first surface far away from the template, and wherein after Step S4 is undertaken Step 4a of keeping heating the electric-conduction material to make a portion of the electric-conduction material flow out of the via hole and protrude from the first surface to form a first electric-conduction pad.

4. The method for fabricating interconnecting lines inside via holes of a semiconductor device according to claim 3, wherein the first electric-conduction pad contacts the first surface.

5. The method for fabricating interconnecting lines inside via holes of a semiconductor device according to claim 3, wherein the substrate includes a second surface neighboring the template, and wherein after Step S4a is undertaken Step 4b of stopping heating the electric-conduction material to make a portion of the electric-conduction material remain outside of the via hole and protrude from the second surface to form a second electric-conduction pad.

6. The method for fabricating interconnecting lines inside via holes of a semiconductor device according to claim 5, wherein the second electric-conduction pad contacts the second surface.

7. The method for fabricating interconnecting lines inside via holes of a semiconductor device according to claim 1, wherein the substrate includes a second surface neighboring the template, and wherein after Step S4 is undertaken Step 4b of stopping heating the electric-conduction material to make a portion of the electric-conduction material remain outside of the via hole and protrude from the second surface to form a second electric-conduction pad.

8. The method for fabricating interconnecting lines inside via holes of a semiconductor device according to claim 7, wherein the second electric-conduction pad contacts the second surface.

9. The method for fabricating interconnecting lines inside via holes of a semiconductor device according to claim 1, wherein the substrate includes a first surface far away from the template, and a circuit on the first surface, and wherein the interconnecting line electrically connects with the circuit.

10. The method for fabricating interconnecting lines inside via holes of a semiconductor device according to claim 1, wherein the electric-conduction material includes a metallic material and a polymeric carrier.

11. The method for fabricating interconnecting lines inside via holes of a semiconductor device according to claim 10, wherein the metallic material is tin, and wherein the working temperature is between 120 and 250° C.

\* \* \* \* \*